(12) United States Patent
Yamamoto et al.

(10) Patent No.: US 7,932,319 B2
(45) Date of Patent: Apr. 26, 2011

(54) THERMOSETTING RESIN COMPOSITION AND SEMICONDUCTOR SEALING MEDIUM

(75) Inventors: Hisanao Yamamoto, Tokyo (JP); Takayuki Matsuda, Tokyo (JP); Hideaki Takahashi, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 394 days.

(21) Appl. No.: 12/083,864

(22) PCT Filed: Oct. 18, 2006

(86) PCT No.: PCT/JP2006/320711
§ 371 (c)(1), (2), (4) Date: Apr. 18, 2008

(87) PCT Pub. No.: WO2007/046399
PCT Pub. Date: Apr. 26, 2007

(65) Prior Publication Data
US 2009/0258992 A1    Oct. 15, 2009

(30) Foreign Application Priority Data
Oct. 18, 2005    (JP) ................................. 2005-303292

(51) Int. Cl.
*C08L 83/04* (2006.01)
*C08G 77/04* (2006.01)
*C08F 283/12* (2006.01)

(52) U.S. Cl. ............. 524/588; 525/474; 528/31; 528/33

(58) Field of Classification Search .................. 524/588; 525/474; 528/33
See application file for complete search history.

(56) References Cited

U.S. PATENT DOCUMENTS

| | | | |
|---|---|---|---|
| 5,037,861 | A | 8/1991 | Crivello et al. |
| 2005/0123776 | A1 | 6/2005 | Yoshikawa |
| 2005/0256286 | A1* | 11/2005 | Asch et al. ...................... 528/31 |

FOREIGN PATENT DOCUMENTS

| | | |
|---|---|---|
| JP | 3-128386 | 5/1991 |
| JP | 3-237749 | 10/1991 |
| JP | 4-142070 | 5/1992 |
| JP | 10-182826 | 7/1998 |
| JP | 10182826 A * | 7/1998 |
| JP | 2004-155865 | 6/2004 |
| JP | 2004-289102 | 10/2004 |
| JP | 2005-89601 | 4/2005 |
| JP | 2005-171021 | 6/2005 |
| JP | 2005-523980 | 8/2005 |
| JP | 2005-272492 | 10/2005 |
| JP | 2005-529989 | 10/2005 |
| WO | 03/093349 A1 | 11/2003 |
| WO | 03/093369 A1 | 11/2003 |

OTHER PUBLICATIONS

Japanese Office Action issued on Feb. 12, 2009 in corresponding Japanese Patent Application 2007-540966.
International Search Report (PCT/ISA/210) mailed on Nov. 21, 2006 in connection with International Application No. PCT/JP2006/320711.

* cited by examiner

*Primary Examiner* — Ling-Siu Choi
*Assistant Examiner* — Chun-Cheng Wang
(74) *Attorney, Agent, or Firm* — Staas & Halsey LLP

(57) ABSTRACT

A thermosetting resin compositing having an essential component (A) organopolysiloxane containing a compound represented by following general formula (1) or (2) and optical semiconductor peripheral material using the composition. [Herein, in the formulas, $R^1$ independently represents a substituted or non-substituted monovalent hydrocarbon radical with the carbon number of 1 to 10, $R^2$ represents an epoxy group-containing organic group, $R^3$ represents $R^1$ or $R^2$, a independently represents an integer of 2 or more, b independently represents an integer of 0 or more, X represents general formula (3), Y represents -o- or a bivalent hydrocarbon radical with the carbon number of 1 to 6, Z represents following formula (4), $R^1$ in the formula independently represents a substituted or non-substituted monovalent hydrocarbon radical with the carbon number of 1 to 10, and c represents an integer of 0 or more.]

30 Claims, No Drawings

THERMOSETTING RESIN COMPOSITION AND SEMICONDUCTOR SEALING MEDIUM

CROSS REFERENCE TO RELATED APPLICATIONS

This application claims the benefit under 35 U.S.C. Section 371, of PCT International Application Number PCT/JP2006/320711, filed Oct. 18, 2006, which claimed priority to Japanese Application Number 2005-303292, filed Oct. 18, 2005 in Japan, the contents of which are incorporated herein by reference.

TECHNICAL FIELD

The present invention relates to a thermosetting resin composition, a resin composition for optical semiconductors, and an optical semiconductor device. More particularly, the invention relates to a thermosetting resin composition suitable for optical semiconductors providing rigid cured materials high in transparency, heat resistance, thermal shock property and adhesion, particularly, providing low-stress cured materials without cure shrinkage excellent in adhesion to semiconductor devices and lead frames, heat resistance and moisture resistance, a resin composition for optical semiconductors such as an optical semiconductor sealing medium, die bonding paste and the like using the thermosetting resin composition, and an optical semiconductor device using the sealing media.

BACKGROUND ART

It has been known that epoxy resin compositions using acid anhydride based curing agents provide transparent cured materials and are suitable as sealing media of optical semiconductor devices such as light emitting diodes, photodiodes and the like.

However, as optical semiconductors have become more sophisticated in recent years, higher performance has been required as performance of sealing media of the semiconductors, and cured materials have been demanded which are excellent in heat resistance, moisture resistance, light resistance and weather resistance, low stress, and further excellent in thermal shock property and adhesion. Therefore, sufficient properties have become hard to obtain in compositions having as the main ingredient epoxy resins of organic resin structure such as bisphenol A epoxy resin, bisphenol F epoxy resin, (3',4'-epoxycyclohexyl)methyl-3,4-epoxycyclohexane carboxylate and the like that have conventionally been used.

DISCLOSURE OF INVENTION

Problems to be Solved by the Invention

To obtain low stress while maintaining heat resistance, amino group-containing silicone is proposed in Japanese Patent Gazette No. 2760889, and adding spherical silica without cracks is proposed in Japanese Patent Gazette No. 2796187. In these techniques, the adhesion to optical semiconductors or leadframes deteriorates, peeling is thereby apt to occur, resulting in a cause of degradation of moisture resistance, and satisfied results have not been obtained.

Further, specific silicone resin compositions are proposed in Japanese Laid-Open Patent Publication No. 2005-171021, however, even the resin compositions do not reach the level of meeting effects in light resistance, heat resistance, adhesion and the like, and particularly, requirements of light resistance.

Meanwhile, specific silicone resin compositions are proposed as coating compositions for releasing paper in Japanese Laid-Open Patent Publication No. H07-216308, however, their cured materials and use for optical semiconductor application are not disclosed. Further, when a photo initiator used in the Publication is used, there is the risk that adequate effects do not appear in transparency, light resistance, heat resistance and further, mechanical properties such as adhesion and the like.

Further, compositions used for releasing paper with specific organopolysiloxane blended thereinto are disclosed in Japanese Laid-Open Patent Publication No. H10-182826, however, as in the above-mentioned document, their cured materials and use for optical semiconductor application are not disclosed. Further, since a photo initiator is blended and the composition is UV-cured, the composition does not always provide cured materials which meet transparency, light resistance, heat resistance, and mechanical properties.

Therefore, development has been desired of transparent thermosetting resin compositions excellent in light resistance and heat resistance and further excellent in adhesion to optical semiconductors, leadframes, and further housing materials.

DISCLOSURE OF INVENTION

It is an object of the invention to provide thermosetting resin compositions which are excellent in adhesion, heat resistance and light resistance, low in cure shrinkage, and low stress, thereby provide cured materials excellent in mechanical properties and are used suitably for optical semiconductors, such resin cured materials for optical semiconductors such as optical semiconductor sealing media, die bonding materials and the like, and optical semiconductor devices using the cured materials.

The inventors of the invention found out that it was possible to achieve the above-mentioned object by inventing a thermosetting resin composition containing specific organopolysiloxane, and reached the present invention. In other words, the invention provides thermosetting resin compositions as described below, and resin compositions for optical semiconductors and optical semiconductor devices which use the thermosetting resin compositions.

A thermosetting resin composition of the invention is characterized by having as an essential component organopolysiloxane containing (A) a compound represented by following general formula (1) and/or a compound represented by general formula (2):

[Chemical 1]

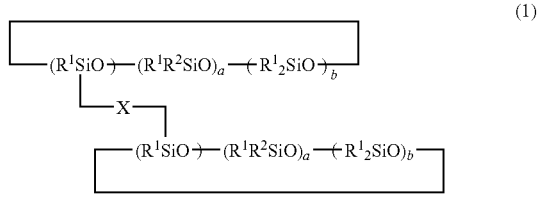

[Chemical 2]

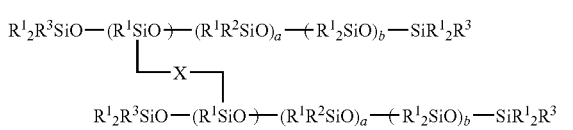

[in the formulas, $R^1$ independently represents a substituted or non-substituted monovalent hydrocarbon radical with the carbon number of 1 to 10, $R^2$ represents an epoxy group-containing organic group, $R^3$ represents $R^1$ or $R^2$, a independently represents an integer of 2 or more, and b independently represents an integer of 0 or more. Further, X is a group represented by general formula (3),

[Chemical 3]

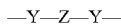
$$—Y—Z—Y— \quad (3)$$

(in the formula, Y represents a bivalent hydrocarbon radical with the carbon number of 1 to 6, Z is a group represented by following formula (4)

[Chemical 4]

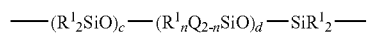
$$——(R^1{}_2SiO)_c——(R^1{}_nQ_{2-n}SiO)_d——SiR^1{}_2—— \quad (4)$$

(in the formula, $R^1$ independently represents a substituted or non-substituted monovalent hydrocarbon radical with the carbon number of 1 to 10, and c represents an integer of 0 or more. Further, n represents 0 or 1, and d represents an integer of 0 or more. Q is a group represented by general formula (5)

[Chemical 5]

$$—P_0—P_1 \quad (5)$$

(in the formula, $P_0$ represents any one of a bivalent hydrocarbon radical with the carbon number of 1 to 10 that may contain -o- bond, ether bond or ester bond, and substituted or non-substituted dimethyl siloxane group, and $P_1$ represents any one of a methyl group, a trimethylsilyl group and structures respectively represented by following formulas (6) and (7).)

[Chemical 6]

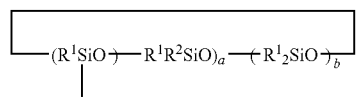
$$(R^1SiO)——R^1R^2SiO)_a——(R^1{}_2SiO)_b \quad (6)$$

[Chemical 7]

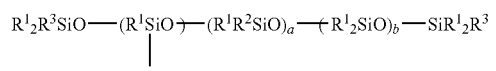
$$R^1{}_2R^3SiO——(R^1SiO)——(R^1R^2SiO)_a——(R^1{}_2SiO)_b——SiR^1{}_2R^3 \quad (7)$$

(in the formulas, $R^1$, $R^2$, $R^3$, a and b represent the same manners as in formulas (1) and (2).)))]

In the thermosetting resin composition of the invention, d in formula (4) is preferably 0.

In the thermosetting resin composition of the invention, essential components are preferably (A) 100 parts by weight of organopolysiloxane containing the compound represented by above-mentioned general formula (1) and/or the compound represented by general formula (2), (B) 10 to 200 parts by weight of acid anhydride, and (C) 0 to 10 parts by weight of accelerator.

In the thermosetting resin composition of the invention, acid anhydride of the (B) component is preferably at least one selected from the group consisting of methylhexahydrophthalic anhydride, hexahydrophthalic anhydride, and methylnagic acid anhydride.

In the thermosetting resin composition of the invention, the accelerator of the (C) component is preferably at least one selected from the group consisting of imidazole compounds, quaternary ammonium salts, phosphonium salts and organophosphinic compounds.

In the thermosetting resin composition of the invention, essential components are preferably 100 parts by weight of organopolysiloxane of the (A) component and (D) 0.001 to 10 parts by weight of cationic polymerization catalyst.

In the thermosetting resin composition of the invention, (D) the cationic polymerization catalyst is preferably a thermosetting cationic polymerization catalyst.

In the thermosetting resin composition of the invention, an epoxy value of organopolysiloxane of the (A) component preferably ranges from 0.050 (equivalent/100 g) to 0.500.

In the thermosetting resin composition of the invention, a in general formulas (1) and (2) preferably ranges from 2 to 10.

In the thermosetting resin composition of the invention, Y in general formula (3) is preferably a bivalent hydrocarbon radical with the carbon number of 1 to 4.

In the thermosetting resin composition of the invention, $R^2$ is preferably a group represented by following general formula (8).

[Chemical 8]

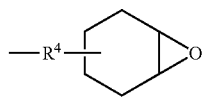

(8)

(In the formula, $R^4$ represents a bivalent hydrocarbon radical with the carbon number of 1 to 10.)

In the thermosetting resin composition of the invention, a weight average molecular weight of organopolysiloxane of the (A) component preferably ranges from 700 to 500000.

In the thermosetting resin composition of the invention, (E) 0.1 to 50 parts by weight of a compound having one or more alcoholic hydroxyl groups in the molecular are preferably contained for 100 parts by weight of organopolysiloxane of the (A) component.

In the thermosetting resin composition of the invention, it is preferable to blend (F) filler with an average particle diameter of 500 nm or less.

An optical semiconductor sealing medium of the invention is characterized by being formed by curing the above-mentioned thermosetting resin composition. Further, a die bonding material for optical semiconductors of the invention is characterized by being formed by curing the above-mentioned thermosetting resin composition.

BEST MODE FOR CARRYING OUT THE INVENTION

The invention will specifically be described below.

In above-mentioned formulas (1) and (2), $R^1$ independently represents a substituted or non-substituted monovalent hydrocarbon radical with the carbon number of 1 to 10. When the carbon number is 10 or less in $R^1$, it is possible to provide both heat resistance and light resistance.

Among preferable $R^1$ from the aforementioned viewpoint are non-substituted or substituted monovalent hydrocarbon radicals including alkyl groups such as methyl groups, ethyl groups, propyl groups, butyl groups, isobutyl groups, tertiary-butyl groups, pentyl groups, neopentyl groups, hexyl groups, cyclopentyl groups, cyclohexyl groups, octyl groups and the like, aryl groups such as phenyl groups, tolyl groups and the like, alkenyl groups such as vinyl groups, allyl groups and the like, and further, substituted radicals such that part or all of hydrogen atoms in the above-mentioned groups are replaced with a halogen atom such as fluorine and the like, glycidyl group, methacrylic group, acrylic group, mercapto group, amino group and the like. Among the compounds, methyl groups and phenyl groups are more preferable in terms of high heat resistance and high light resistance, and methyl groups are particularly preferable in terms of particularly excellent light resistance.

$R^2$ represents an epoxy group-containing organic group, and examples thereof are structures as described below. Among the structures, the structure represented by general formula (8) is more preferable in terms of high stability of organopolysiloxane of the A component, and high heat resistance of the resin obtained by curing.

[Chemical 9]

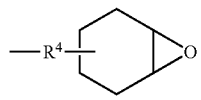

(8)

[Chemical 10]

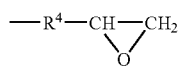

(9)

[Chemical 11]

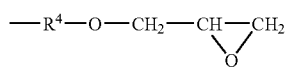

(10)

[Chemical 12]

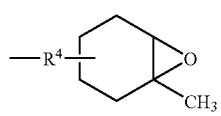

(11)

$R^4$ in general formulas (8) to (11) represents a bivalent hydrocarbon radical with the carbon number of 1 to 10. The carbon number of $R^4$ is 10 or less from the viewpoint of heat resistance and light resistance. Among $R^4$ structures preferable from such a viewpoint are —(CH$_2$)—, —(CH$_2$)$_2$—, —(CH$_2$)$_3$—, —(CH$_2$)$_4$—, —(CH$_2$)$_5$—, —(CH$_2$)$_6$—, —(CH$_2$)$_8$—, —(CH$_2$)$_{10}$—, —CH(CH$_3$)CH$_2$—, —C(CH$_3$)$_2$— and the like, and particularly preferred are —(CH$_2$)$_2$—, —(CH$_2$)$_3$—, and —CH(CH$_3$)CH$_2$—.

With the aforementioned factors considered, among preferable $R^2$ structures are 3-glycidoxypropyl group, 2-(3',4'-epoxycyclohexyl)ethyl groups, 3-(2'-hydroxyethoxy)propyl groups and the like, and 2-(3',4'-epoxycyclohexyl)ethyl groups are particularly preferable in terms of the fact that the groups provide stable compounds at room temperature and that the cured materials exhibit high heat resistance.

$R^3$ represents $R^1$ or $R^2$, and methyl groups, and 2-(3',4'-epoxycyclohexyl)ethyl groups are preferable in terms of balance between the viscosity of organopolysiloxane and heat resistance of cured materials.

a in general formulas (1) and (2) independently represents an integer of 2 or more, preferably ranges from 2 to 20 from the balance between the viscosity of organopolysiloxane and heat resistance of cured materials, more preferably from 2 to 10, further preferably 2 to 5, and most preferably 3.

b in general formulas (1) and (2) independently represents an integer of 0 or more, preferably ranges from 0 to 20 from the viewpoint that the balance among heat resistance, light resistance, glass transition temperature and mechanical strength such as adhesion and the like of the cured materials is more excellent as b decreases, more preferably from 0 to 10, further preferably 0 to 5, and most preferably 0.

X in general formulas (1) and (2) is a group represented by following general formula (3).

[Chemical 13]

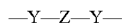

(3)

Y in general formula (3) represents a bivalent hydrocarbon radical with the carbon number of 1 to 6, and examples thereof are —(CH$_2$)—, —(CH$_2$)$_2$—, —(CH$_2$)$_3$—, —(CH$_2$)$_4$—, —(CH$_2$)$_5$—, —(CH$_2$)$_6$—, —(CH$_2$)—CH(CH$_2$)CH$_2$—, —C(CH$_3$)$_2$— and the like. Y is preferably a bivalent hydrocarbon radical with the carbon number of 1 to 4. More specifically, more preferred are —(CH$_2$)$_2$—, —(CH$_2$)$_3$— and —(CH$_2$)$_4$— in the respect that the manufacturing is easy and that less colored cured materials with excellent light resistance and thermal shock property are provided, and most preferred is —CH(CH$_3$)CH$_2$—.

Z in general formula (3) represents the structure of following general formula (4).

[Chemical 14]

(4)

$R^1$ in formula (4) independently represents a substituted or non-substituted monovalent hydrocarbon radical with the carbon number of 1 to 10. The carbon number of $R^1$ is 10 or less from the viewpoint of heat resistance and light resistance. Among preferable $R^1$ are alkyl groups such as methyl groups, ethyl groups, propyl groups, butyl groups, isobutyl groups, tertiary-butyl groups, pentyl groups, neopentyl groups, hexyl groups, cyclopentyl groups, cyclohexyl groups, octyl groups and the like, aryl groups such as phenyl groups, tolyl groups and the like, and alkenyl groups such as vinyl groups, allyl groups and the like, methyl groups and phenyl groups are more preferable in terms of high heat resistance and high light resistance, and methyl groups are most preferable in terms of particularly excellent light resistance.

Further, c in general formula (4) represents an integer of 0 or more. There is a tendency to provide cured materials such that heat resistance increases as c decreases and that toughness and thermal shock resistance increases as c increases. From the viewpoint of the balance between them, c preferably ranges from 0 to 100, more preferably from 0 to 50, further preferably from 1 to 40, and most preferably 1 to 30.

Furthermore, n in general formula (4) represents or 1, and is preferably 1 from the viewpoint of exhibiting the effects of the invention remarkably.

Still furthermore, d in general formula (4) represents an integer of 0 or more, preferably decreases from the viewpoint of lower viscosity of the resin composition, and the viewpoint of higher toughness and higher adhesion of the cured material, and is particularly preferably 0.

Moreover, Q in general formula (4) is represented by general formula (5).

[Chemical 15]

(5)

In general formula (5), $P_0$ represents any one of a bivalent hydrocarbon radical with the carbon number of 1 to 10 that may contain -o- bond, ether bond or ester bond, and substituted or non-substituted dimethyl siloxane group. Specific examples thereof include
—CH$_2$CH$_2$—,
—O—,
—(CH$_2$)$_3$—OCO—CH(CH$_3$)CH$_2$—,
—(OSi(CH$_3$)$_2$)$_7$—O—,
—CH$_2$CH$_2$—(Si(CH$_3$)$_2$O)$_7$Si—CH$_2$CH$_2$—, and the like, and the structures of —C$_2$H$_4$— are easy to industrially obtain raw materials.

Further, $P_1$ in general formula (5) represents any one of a methyl group, a trimethylsilyl group and structures respectively represented by following formulas (6) and (7), and the structure of formula (6) is preferred from the viewpoint of exhibiting the effects of the invention remarkably. $R^1$, $R^2$, $R^3$, a and b are the same as in formulas (1) and (2).

[Chemical 16]

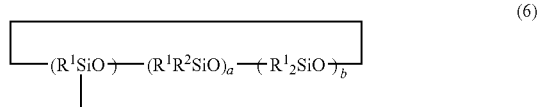

(6)

[Chemical 17]

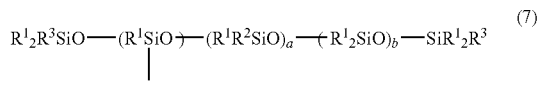

(7)

In the invention, the (A) component is organopolysiloxane containing the compound represented by general formula (1) and/or general formula (2). In this organopolysiloxane, in the same molecular exist parts where the epoxy group exists relatively in high concentration; i.e. parts of general formulas (1) and (2) except X, and part X where the epoxy group exists relatively in low concentration or does not exist. Therefore, the parts where the epoxy group exists relatively in high concentration contribute to development of mechanical strength and thermal properties. Meanwhile, the X part expresses more flexible structure, reduces cure shrinkage, absorbs internal stress, and as a result, serves to develop excellent adhesion and thermal shock property. Further, introduction of the X part suppresses the concentration of the epoxy group that does not necessarily contribute to light resistance, and therefore, has the effect of developing excellent light resistance.

From such a viewpoint, the compound represented by general formula (1) develops the effects of the invention more remarkably, and is particularly preferred. More specifically, when the resins represented by formulas (1) and (2) are compared with each other, in the resins with the equal degree of light resistance, the resin represented by formula (1) exhibits more excellent properties in the glass transition temperature (Tg), thermal shock property, adhesion and solder heat resistance.

Further, the (A) component in the invention is not limited particularly in weight average molecular weight, but the weight average molecular weight preferably ranges from 700 to 5000000. The weight average molecular weight of 700 or more provides excellent light resistance. From such a viewpoint, the range of the weight average molecular weight is more preferably from 1000 to 100000, further preferably from 1000 to 20000, more preferably from 1000 to 10000, and most preferably from 1000 to 5000. In addition, the weight average molecular weight of the (A) component is specified by the weight average molecular weight in GPC measurement.

The epoxy value of the (A) component in the invention is preferably more than or equal to 0.050 (equivalent/100 g) from the viewpoint of heat resistance, and less than or equal to 0.500 (equivalent/100 g) from the viewpoint of light resistance. From such viewpoints, the epoxy value ranges more preferably from 0.100 (equivalent/100 g) to 0.450 (equivalent/100 g), and most preferably from 0.150 (equivalent/100 g) to 0.400 (equivalent/100 g).

The content of the compound represented by general formula (1) or (2) contained in organopolysiloxane of the (A) component is desirably in the range of 0.01% to 100% in mass standard. The content of the compound represented by general formula (1) or (2) ranges more preferably from 0.1% to 90%, further preferably from 5% to 60%, and most preferably from 10% to 50%.

The thermosetting resin composition of the invention preferably contains the (A) component, and (B) acid anhydride, and (C) accelerator as necessary. The cured material obtained by curing with acid anhydride tends to provide the cured material high in glass temperature, and excellent in adhesion and thermal shock property. Among acid anhydrides capable of being used as the (B) component in the invention are colorless or light yellow acid anhydrides such as hexahydrophthalic anhydride, tetrahydrophthalic anhydride, methylhexahydrophthalic anhydride, methyltetrahydrophthalic anhydride, methylnagic acid anhydride, phthalic anhydride, trimellitic anhydride, pyromellitic acid anhydride, succinic anhydride and the like, and it is possible to use one kind alone or combine two or more kinds to use. Among the compounds, methylhexahydrophthalic anhydride, hexahydrophthalic anhydride, and methylnagic acid anhydride are particularly preferred from the viewpoint of light resistance and heat resistance.

The blending quantity of acid anhydride is preferably in the range of 0.2 to 5 equivalents to the epoxy group of the (A) component from the viewpoint of moisture resistance and life used as LED sealing media, and particularly the range of 0.5 to 2 equivalents is preferred. The blending quantity of acid anhydride desirably ranges from 10 to 100 parts by weight to 100 parts by weight of the (A) component, more preferably from 10 to 100 parts by weight and most preferably from 20 to 80 parts by weight.

Among accelerators capable of being used as the (C) component in the invention are imidazole compounds, quaternary ammonium salts, phosphonium salts, amine compounds, aluminum chelates, organophosphine compounds and the like. Among the compounds, imidazole compounds, quaternary ammonium salts, phosphonium salts, and organophosphine compounds tend to provide less colored cured materials, and are preferred.

Specific examples are amino compounds and their slats such as 2-methyl imidazole, 2-ethyl-4-methyl imidazole, 1,8-diaza-bicyclo(5,4,0)-undec-7-ene, trimethylamine, benzyldimethyamine, triethylamine, dimethylbenzylamine, 2,4,6-trisdimethylaminomethylphenol and the like, quaternary ammonium salts such as tetramethylammonium chloride, benzyltrimethylammonium bromide, tetrabutyl ammonium bromide and the like, aluminum chelates, organophosphine compounds such as tetra-n-butylphosphonium benzotriazolate, tetra-n-butylphosphonium-O,O-diethylphosphorodithioate and the like, Cr(III) tricarboxylate, tin octonate, acetylacetonatoCr and the like. Among the compounds, tetramethylammonium chloride, tetra-n-butylphosphonium-O, O-diethylphosphorodithioate and the like tend to provide less colored cured materials. Further, as commercially available products, it is possible to suitably use U-CAT SA1, U-CAT 2026, U-CAT 18X and the like by SAN-APRO Ltd.

The blending quantity of the accelerators is desirably more than or equal to 0 part by weight to 100 parts by weight of the (A) component and less than or equal to 10 parts by weight from the viewpoint of moisture resistance. The blending quantity is more preferably more than or equal to 0.001 part by weight from the viewpoint of reactivity, ranges further preferably from 0.01 to 5 parts by weight, and most preferably 0.01 to 1 part by weight.

In the thermosetting resin composition of the invention, it is possible to obtain cured materials by blending (D) cationic polymerization catalyst. Among such cationic polymerization catalysts are Lewis acid catalysts typified by $BF_3$.amine complex, $PF_5$, $BF_3$, $AsF_5$, $SbF_5$ and the like, thermosetting cationic polymerization catalysts typified by phosphonium salts and quaternary ammonium salts, UV curing cationic polymerization catalysts typified by diaryliodonium-hexafluorophosphate, hexafluoroantimonatebis(dodecylphenyl)iodonium and the like, and so on. The thermosetting cationic polymerization catalysts provide less colored transparent cured materials with high glass transition temperature and with excellent solder heat resistance and adhesion, and therefore, are preferable.

Among such thermosetting cationic polymerization catalysts are sulfonium salts, benzylammonium salts, benzylpyridinium salts, benzylsulfonium salts, hydrazinium salts, carboxylate, sulfonate, amine imide and the like. Sulfonium salts and benzylsulfonium salts tend to provide uniform cured materials with high glass transition temperature.

Examples of the structure of sulfonium salts are formulas (12) and (13).

[Chemical 18]

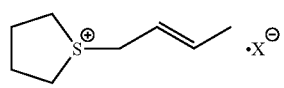
(12)

[Chemical 19]

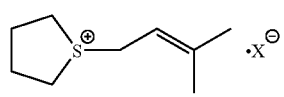
(13)

(In the above-mentioned formulas, X— represents $PF_6$—, $SbF_6$—, or $AsF_6$—.)

Examples of the structure of benzylsulfonium salts include formula (14).

[Chemical 20]

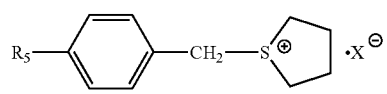
(14)

(In the aforementioned formula, $R^5$ represents an alkyl group with the carbon number of 1 to 12 or an alkoxy group with the carbon number of 1 to 12, and X— represents $PF_6$—, $SbF_6$—, or $AsF_6$—.)

Examples of the structure of benzylammonium salts include formula (15).

[Chemical 21]

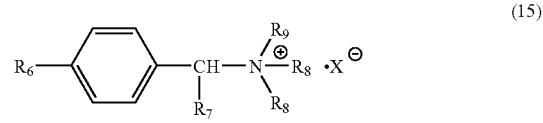
(15)

(In the aforementioned formula, $R^6$ to $R^9$ independently represent hydrogen, an alkyl group with the carbon number of 1 to 12 or an alkoxy group with the carbon number of 1 to 12, and X— represents $PF_6$—, $SbF_6$—, or $AsF_6$—.)

Examples of the structure of benzylpyridinium salts include formula (16).

[Chemical 22]

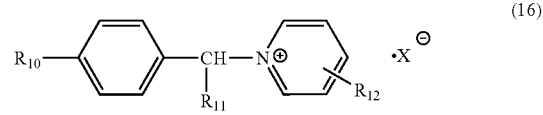
(16)

(In the aforementioned formula, $R^{10}$ to $R^{12}$ independently represent hydrogen, an alkyl group with the carbon number of 1 to 12 or an alkoxy group with the carbon number of 1 to 12, and X— represents $PF_6$—, $SbF_6$—, or $AsF_6$—.)

Examples of the structure of benzylphosphonium salts include formula (17).

[Chemical 23]

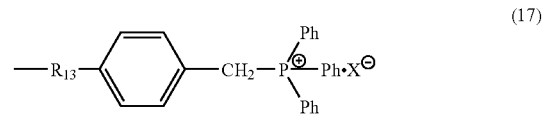
(17)

(In the aforementioned formula, $R^{13}$ independently represents hydrogen, an alkyl group with the carbon number of 1 to 12 or an alkoxy group with the carbon number of 1 to 12, and X— represents $PF_6$—, $SbF_6$—, or $AsF_6$—.)

Among the salts, the salts where X is $SbF_6$— in formula (12) tend to exhibit uniform colorless and high glass transition temperature.

It is possible to use commercially available products as the cationic polymerization catalyst. Among commercially available products are, for example, SI-100L and SI-60L (SAN-SHIN CHEMICAL INDUSTRY CO., LTD.), CP-66 and CP-77 (ADEKA CORPORATION) and the like which are sulfonium salt-based cationic polymerization initiators.

Further, examples of UV curing cationic polymerization catalysts include hexafluoroantimonatebis(dodecylphenyl) iodonium.

As the blending quantity of the cationic polymerization catalyst, in consideration of obtaining a uniform cured material, it is preferably to blend 0.001 to 10 parts by weight of cationic polymerization catalyst to 100 parts by weight of organopolysiloxane of the (A) component. The blending quantity of the polymerization catalyst to 100 parts by weight of organopolysiloxane of (A) component ranges more preferably from 0.005 to 1 part by weight, and most preferably from 0.01 to 0.1 part by weight.

It is possible to enhance adhesion by blending (E) a compound having one or more alcoholic hydroxyl groups in the molecular into the thermosetting resin composition of the invention. Among such compounds are monohydric alcohols such as pentyl alcohol, butanol, octanol and the like, dihydric alcohols such as ethylene glycol, diethylene glycol, triethylene glycol, polyethylene glycol, propylene glycol, dipropylene glycol, tripropylene glycol, polypropylene glycol, octanediol, butanediol, hexanediol, neopentyl glycol and the like, alcohols of trivalent or more such as glycerin, erythritol, trimethylolpropane, 1,2,4-butanetriol and the like, and so on. Among the compounds, preferable in terms of outstanding development of the effect are ethylene glycol, diethylene glycol, triethylene glycol, propylene glycol, dipropylene glycol, and tripropylene glycol.

The blending quantity of the compound having one or more alcoholic hydroxyl groups in the molecular is desirably more than or equal to 0.1 part by weight from the viewpoint of enhancing adhesion and less than or equal to 50 parts by weight from the viewpoint of heat resistance and moisture resistance, to 100 parts by weight of organopolysiloxane of the (A) component. The blending quantity ranges more preferably from 1 to 30 parts by weight, further preferably from 3 to 20 parts by weight, and most preferably from 5 to 10 parts by weight.

Described next is a method of manufacturing organopolysiloxane that is the (A) component of the invention.

Among the organopolysiloxanes that are the (A) component of the invention, compounds with d of 0 in formula (4) are capable of being manufactured using as materials organopolysiloxanes with unsaturated hydrocarbon groups at both terminals, organohydropolysiloxane, and a compound having an epoxy group and alkenyl group in the molecular.

Specific examples of organopolysiloxane with unsaturated hydrocarbon groups at both terminals are as follows:

$CH_2=CHSi(Me)_2O\text{-}Si(Me)_2CH=CH_2$
$CH_2=CHSi(Me)_2O\text{-}Si(Me)_2O\text{-}Si(Me)_2CH=CH_2$
$CH_2=CHSi(Me)_2O\text{-}(Si(Me)_2O)_2\text{—}Si(Me)_2CH=CH_2$
$CH_2=CHSi(Me)_2O\text{-}(Si(Me)_2O)_3\text{—}Si(Me)_2CH=CH_2$
$CH_2=CHSi(Me)_2O\text{-}(Si(Me)_2O)_6\text{—}Si(Me)_2CH=CH_2$
$CH_2=CHSi(Me)_2O\text{-}(Si(Me)_2O)_8\text{—}Si(Me)_2CH=CH_2$
$CH_2=CHSi(Me)_2O\text{-}(Si(Me)_2O)12\text{-}Si(Me)_2CH=CH_2$
$CH_2=CHSi(Me)_2O\text{-}(Si(Me)_2O)_2O\text{-}Si(Me)_2CH=CH_2$
$CH_2=CHCH_2Si(Me)_2O\text{-}Si(Me)_2CH_2CH=CH_2$
$CH_2=CHCH_2Si(Me)_2O\text{-}Si(Me)_2O\text{—}Si(Me)_2CH_2CH=CH_2$ As the organopolysiloxanes with the unsaturated hydrocarbon groups at both terminals, one kind may be used alone or two or more kinds may be used as a mixture.

As organohydropolysiloxane, it is possible to use compounds represented by general formula (18) or (19).

[Chemical 24]

$$-(R^1HSiO)_a-(R^1{}_2SiO)_b- \quad (18)$$

(In the formula, a and b are the same as described previously.)

[Chemical 25]

$$R^1{}_2R^{11}SiO-(R^1HSiO)_a-(R^1{}_2SiO)_b-SiR^1{}_2R^{11} \quad (19)$$

(In the formula, $R^1$, a and b are the same as described previously, and $R^{11}$ represents $R^1$, or a hydrogen atom.)

Specific examples of organohydropolysiloxane include compounds represented by following formulas (20) to (26).

[Chemical 26]

$$-(MeHSiO)_4- \quad (20)$$

[Chemical 27]

$$-(MeHSiO)_4-(Me_2SiO)_2- \quad (21)$$

[Chemical 28]

$$-(MeHSiO)_6- \quad (22)$$

[Chemical 29]

$$Me_3SiO-(MeHSiO)_4-SiMe_3 \quad (23)$$

[Chemical 30]

$$Me_2HSiO-(MeHSiO)_4-SiMe_2H \quad (24)$$

[Chemical 31]

$$Me_3SiO-(MeHSiO)_4-(Me_2SiO)_2-SiMe_3 \quad (25)$$

[Chemical 32]

$$Me_2HSiO-(MeHSiO)_4-(Me_2SiO)_2-SiMe_2H \quad (26)$$

The above-mentioned organohydropolysiloxane may be used in a mixture of two or more kinds or alone.

As an epoxy group of the compound having the epoxy group and an alkenyl group in the molecular, examples are structures represented by general formulas (8) to (11). Among the alkenyl groups are compounds with the carbon number of 2 to 8 such as vinyl groups, allyl groups, propenyl groups, butenyl groups and the like.

Among such compounds are, for example, 4-vinylcyclohexaneoxide, 4-isopropenyl-1-methylcyclohexaneoxide, allylglycidylether, 1,5-hexadienmonooxide, glycidyl(meta) acrylate, and the like.

Among the organopolysiloxanes of the (A) component of the invention, compounds with d in formula (4) being an integer of 1 or more are capable of being manufactured, for example, by using organopolysiloxane having unsaturated hydrocarbon groups at both terminals with unsaturated hydrocarbon groups substituted for part or all of dimethylsiloxy groups of the chain, or organopolysiloxane having unsaturated hydrocarbon groups at both terminals with hydroxyl groups substituted for part or all of dimethylsiloxy groups of the chain, organohydropolysiloxane, and the compound having the epoxy group and alkenyl group in the molecular as raw materials, and causing hydrosilation, for example, using a Pt-based catalyst.

Further, in the invention, among organopolysiloxanes of the (A) component, compounds with d in formula (4) being an integer of 1 or more can also be manufactured by, for example, using a Sn-based catalyst to cause a dehydrocondensation reaction between, for example, organopolysiloxane having silanol groups at both terminals with hydroxyl groups substituted for part or all of methyl groups of dimethylsiloxy groups of the chain, and organohydropolysiloxane containing SiH groups more in equivalent than SiOH groups contained in the organopolysiloxane, and then, for example, using a Pt-based catalyst to further cause an addition reaction between alkenyl groups of the compound containing the epoxy group and alkenyl group in the molecular and remaining SiH groups.

Alternatively, it is possible to manufacture the compounds by using organopolysiloxane having silanol groups at both terminals with hydroxyl groups substituted for part or all of dimethylsiloxy groups of the chain, organohydropolysiloxane, and the compound having the epoxy group and alkenyl group in the molecular as raw materials, and combining the hydrogenation reaction and hydrosilation reaction, for example, using a Pt-based or Sn-based catalyst.

Further, it is also possible to obtain organopolysiloxanes of the (A) component by combining the dehydrocondensation reaction between SiOH groups of organopolysiloxane (iv) having OH groups at both terminals and part of SiH groups contained in organohydropolysiloxane (i), and the addition reaction between unsaturated bonds of the compound (ii) having the epoxy group and alkenyl group in the molecular and part of SiH groups contained in organohydropolysiloxane (i).

Further, it is also possible to manufacture the compounds using organopolysiloxane having unsaturated hydrocarbon groups at both terminals with —$(CH_2)_3$—OCO—$C(CH_3)$=$CH_2$ groups substituted for part or all of dimethylsiloxy groups of the chain, organohydropolysiloxane, and the compound having the epoxy group and alkenyl group in the molecular as raw materials, and causing hydrosilation, for example, using a Pt-based catalyst.

It is possible to obtain the organopolysiloxanes of the (A) component by combining the addition reaction between part of SiH groups contained in organohydropolysiloxane (i) and the alkenyl groups of the compound (ii) having the epoxy group and alkenyl group in the molecular, and the addition reaction between part of SiH groups contained in the compound (i) and the unsaturated bonds of organopolysiloxane (iii) having unsaturated bonds such as vinyl groups or the like at both terminals.

As the usage rate of organohydropolysiloxane (i), the compound (ii) having the epoxy group and alkenyl group in the molecular and organopolysiloxane (iii) having unsaturated bonds such as vinyl groups or the like at both terminals at this point, the ratio in the total number of moles of vinyl groups contained in (ii) and (iii) to SiH groups contained in (i) is desirably between 0.8/1.0 and 1.2/1.0. The aforementioned mole ratio is preferably more than or equal to 0.8/1.0 from the viewpoint of light resistance and heat resistance and less than or equal to 1.2/1.0 from the viewpoint of stability of the viscosity, and heat resistance and strength of the cured material. The mole ratio preferably approaches 1.0, and more preferably is between 0.95/1.0 and 1.05/1.0.

In the above-mentioned addition reaction, the usage rate of the compound (ii) having the epoxy group and alkenyl group in the molecular, and organopolysiloxane (iii) having unsaturated bonds such as vinyl groups or the like at both terminals is not particularly limited, but from the viewpoint of heat resistance, the mole ratio of contained vinyl groups is desirably more than or equal to 1:100 from the viewpoint of heat resistance, and less than or equal to 100:1 from the viewpoint of light resistance. The range is more desirably from 95:5 to 20:80, further preferably from 90:10 to 40:60, and most preferably 80:20 to 50:50.

In the reaction of the compound (ii) having the epoxy group and alkenyl group in the molecular and organopolysiloxane (iii) having unsaturated bonds such as vinyl groups or the like at both terminals with organohydropolysiloxane (i), (ii) and (iii) may be added at the same time, or one of (ii) and (iii) may be added prior to the other one to react earlier. In this case, when (ii) is caused to react earlier, there is a tendency that the viscosity of obtained organopolysiloxane is lower. Meanwhile, when (iii) is caused to react earlier, there is a tendency to be able to obtain less colored organopolysiloxane. Further, when one of (ii) and (iii) is caused to react with (i) earlier, the remaining one may be caused to react continuously, or to react after isolating in-progress polysiloxane.

In the above-mentioned addition reaction, to cause the reaction to progress promptly, it is preferable to use a catalyst. Among the catalysts are platinum-based catalysts such as platinum chloride, alcohol solution of platinum chloride, reactant of platinum chloride and alcohol, reactant of platinum chloride and olefin compound, reactant of platinum chloride and vinyl group-containing siloxane, and the like.

The addition amount of the catalyst is not particularly limited, but preferably ranges from 0.0001 to 5 percent by weight to the total weight of organohydropolysiloxane (i), the compound (ii) having the epoxy group and alkenyl group in the molecular and organopolysiloxane (iii) having unsaturated bonds such as vinyl groups or the like at both terminals. The addition amount of the catalyst is preferably more than or equal to 0.0001 percent by weight from the viewpoint of obtaining the addition effect and less than or equal to 5 percent by weight from the viewpoint of light resistance of the obtained cured material of organohydropolysiloxane.

The addition reaction can usually be carried out at temperatures between room temperature and 300° C., and proceeds faster at temperatures of 30° C. or more. The reaction at temperatures of 120° C. or less provides less colored organohydropolysiloxane and is preferable. In addition, the reaction time is not particularly limited, but preferably ranges from 1 to 50 hours.

The reaction carried out in a solvent as required causes the viscosity of obtained organopolysiloxane to decrease and is preferable. As the solvent, it is possible to use aromatic solvents such as toluene, xylene and the like, aliphatic solvents such as hexane, octane and the like, ketones such as methyl ethyl ketone, methyl isobutyl ketone and the like, esters such as ethyl acetate, isobutyl acetate and the like, ethers such as diisopropyl ether, 1,4-dioxane, diethyl ether, tetrahydrofuran, ethylene glycol dimethyl ether, ethylene glycol diethyl ether, propylene glycol monomethyl ether acetate and the like, alcohols such as isopropanol and the like, or mixed solvents thereof, and particularly, dioxane has a tendency to cause the reaction to proceed promptly and is preferable.

As an atmosphere in the reaction, either is usable an atmosphere of air or inert gas. In terms of less coloring of obtained organohydropolysiloxane, the reaction is preferably performed in an atmosphere of inert gas such as nitrogen, argon, helium and the like.

After finishing the addition reaction, it is possible to remove the catalyst of addition reaction by a general method such as washing, activated carbon treatment and the like of the reaction mixture. When the solvent is used, the mixture is distilled under heating and/or a reduced pressure to remove the solvent, and it is possible to obtain organopolysiloxane of the (A) component.

Examples of the compound included in thus obtained organopolysiloxane of the (A) component of the invention are represented by following formulas (27) and (28).

[Chemical 33]

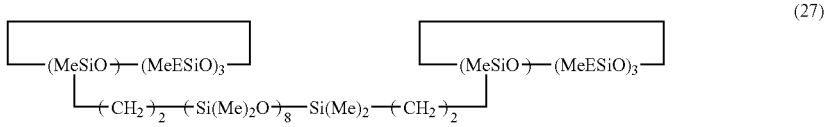
(27)

[Chemical 34]

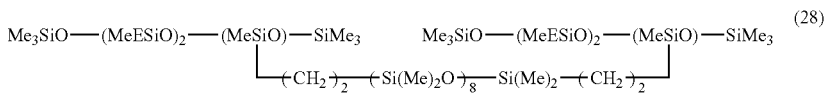
(28)

(E in the formula represents a 3,4-epoxycyclohexylethyl group.)

Thus obtained organopolysiloxane of the (A) component of the invention can be manufactured industrially by reaction accompanied by consecutive polymerization reaction, and therefore, can usually be used as a mixture containing an addition product of organohydropolysiloxane (i) and the compound (ii) having the epoxy group and alkenyl group in the molecular as well as the compound represented by general formula (1), and consecutive polymers as described below.

For example, when the reaction occurs among organohydropolysiloxane represented by formula (20), organopolysiloxane having unsaturated bonds at both terminals represented by $CH_2=CHSi(Me)_2O-(Si(Me)_2O)_7-Si(Me)_2 CH=CH_2$ and 4-vinylcyclohexaneoxide by the above-mentioned method, it is possible to obtain organopolysiloxane of the (A) component containing the compound of formula (27), and organopolysiloxane of the (A) component in this case also contains consecutive polymers generally represented by formulas (29) and (30) to (31) or branched compounds.

[Chemical 35]

(20)

[Chemical 36]

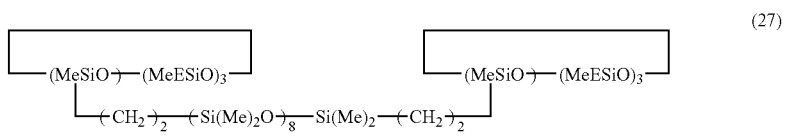
(27)

(E in the formula represents a 3,4-epoxycyclohexylethyl group.)

[Chemical 37]

(29)

[Chemical 38]

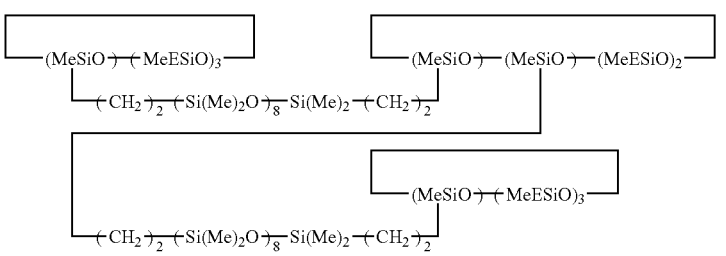
(30)

(E in the formula represents a 3,4-epoxycyclohexylethylene group.)

[Chemical 39]

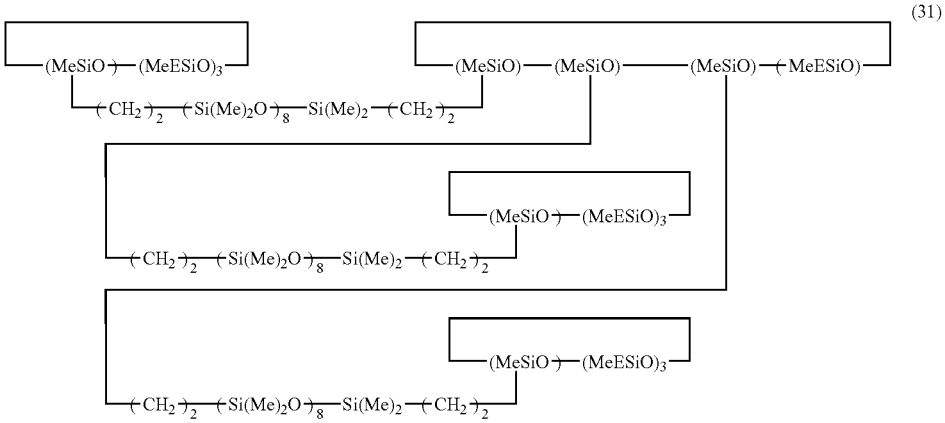
(31)

(E in the formula represents a 3,4-epoxycyclohexylethyl group.)

As described previously, the content of the compound represented by general formula (1) or (2) contained in organopolysiloxane of the (A) component is desirably in the range of 0.01% to 100% in mass standard. The content of the compound represented by general formula (1) or (2) ranges more preferably from 0.1% to 90%, further preferably from 5% to 60%, and most preferably from 10% to 50%.

Furthermore, it is also possible to obtain organopolysiloxanes of the (A) component by combining the dehydrocondensation reaction between SiOH groups of organopolysiloxane (iv) having OH groups at both terminals and part of SiH groups contained in organohydropolysiloxane (i), and the addition reaction between unsaturated bonds of the compound (ii) having the epoxy group and alkenyl group in the molecular and part of SiH groups contained in organohydropolysiloxane (i).

At this point, as the usage rate of organopolysiloxane (iv) having OH groups at both terminals, organohydropolysiloxane (i), and the compound (ii) having the epoxy group and alkenyl group in the molecular, the ratio in the total number of moles of SiH groups contained in (i), vinyl groups contained in (ii) and OH groups contained in (iv) is desirably between 0.8/1.0 and 1.2/1.0. The aforementioned mole ratio is preferably more than or equal to 0.8/1.0 from the viewpoint of heat resistance and light resistance and less than or equal to 1.2/1.0 from the viewpoint of stability of the viscosity, and heat resistance and strength of the cured material. The mole ratio preferably approaches 1.0, and more preferably is between 0.95/1.0 and 1.05/1.0.

In the above-mentioned reaction, the usage rate of the compound (ii) having the epoxy group and alkenyl group in the molecular, and organopolysiloxane (iv) having OH groups at both terminals is not particularly limited, but from the viewpoint of heat resistance, the mole ratio between vinyl groups contained in (ii) and OH groups contained in (iv) is desirably more than or equal to 1:100 from the viewpoint of heat resistance, and less than or equal to 100:1 from the viewpoint of light resistance. The range of the mole ratio is more desirably from 90:10 to 20:80, further preferably from 85:15 to 45:55, and most preferably 80:20 to 60:40.

In the above-mentioned reaction, in the reaction of the compound (ii) having the epoxy group and alkenyl group in the molecular and organopolysiloxane (iv) having OH groups at both terminals with organohydropolysiloxane (i), both compounds may be added at the same time, or one of (ii) and (iv) may be added prior to the other one to react earlier. Causing (iv) to react earlier has a tendency that the viscosity of obtained organopolysiloxane during storage is stable, and another tendency that heat resistance of the cured material is high, and is more preferable. In this case, after finishing the dehydrocondensation reaction, the product of the dehydrocondensation reaction of organopolysiloxane having OH groups at both terminals and organohydropolysiloxane may be isolated from the mixture of the reaction and purified. At the stage of isolation and purification, the dehydrocondensation catalyst can be removed by treating the mixture of the reaction using an adsorbent such as activated carbon and the like. Meanwhile, in the case of using a solvent, the solvent can be distilled and removed under heating and/or a reduced pressure.

Further, when one of (ii) and (iv) is reacted earlier, the remaining one may be reacted subsequently or reacted after isolating in-progress polysiloxane.

Catalysts can be used in the above-mentioned dehydrocondensation reaction. As the catalyst, it is possible to use platinum-based catalysts such as platinum chloride, alcohol solution of platinum chloride, reactant of platinum chloride and alcohol, reactant of platinum chloride and olefin compound, reactant of platinum chloride and vinyl group-containing siloxane, and the like, and Sn-based catalysts such as dibutylin dilaurate and the like.

The addition amount of the catalyst is not particularly limited, but preferably ranges from 0.0005 to 5 percent by weight to the total weight of organopolysiloxane having OH groups at both terminals and organohydropolysiloxane.

This reaction can generally be carried out at RT to 300° C. In this case, the reaction proceeds faster by heating to 50° C. or more. In addition, the reaction time is not limited, but is preferably from 1 to 10 hours.

The reaction can be carried out in a solvent as required. As the solvent, it is possible to use aromatic solvents such as toluene, xylene and the like, aliphatic solvents such as hexane, octane and the like, ketones such as methyl ethyl ketone, methyl isobutyl ketone and the like, esters such as ethyl acetate, isobutyl acetate and the like, ethers such as diisopropyl ether, 1,4-dioxane, diethyl ether, tetrahydrofuran, ethylene glycol dimethyl ether, ethylene glycol diethyl ether, propylene glycol monomethyl ether acetate and the like, alcohols such as isopropanol and the like, or mixed solvents thereof.

As an atmosphere in the reaction, either is usable an atmosphere of air or inert gas. In terms of less coloring of obtained organohydropolysiloxane, the reaction is preferably performed in an atmosphere of inert gas such as nitrogen, argon, helium and the like.

For the purpose of further providing adhesion, flexibility and the like, it is possible to blend an organic resin into the thermosetting resin composition of the invention. Among the organic resins are epoxy resins, acrylic resins, polyester resins, polyimide resins and the like. Particularly, preferred are resins having groups capable of reacting with the other components, and epoxy resins are preferable. Among the epoxy resins are BISA epoxy resins, BISF epoxy resins, hydrogenation epoxy resins, 3,4-epoxycyclohexylmethyl-3,4-epoxycyclohexane carboxylate and the like.

The organic resin is capable of being used within the range of not impairing the object of the invention, and the blending amount generally ranges from 0 to 80 parts by weight and preferably from 0 to 30 parts by weight to 100 parts by weight of the (A) component.

It is possible to blend an additive such as dye, antidegradant, lubricant, antioxidant, silane coupling agent, heat stabilizing agent, plasticizer, surfactant and the like into the thermosetting resin composition of the invention within the quantitative and qualitative range of not departing from the scope of the invention. Further, for the purpose of improving heat resistance, light resistance, hardness, electrical conductivity, thermal conductivity, thixotropic properties, and low-thermal expansion properties, and the like, it is possible to blend filler typified by inorganic oxide as required into the thermosetting resin composition of the invention.

Among such fillers are inorganic oxides or inorganic nitrides such as silica (fumed silica, colloidal silica, sedimentary silica and the like), silicon nitride, boron nitride, alumina, titanic and the like, glass, ceramics, silver powder, cupper powder and the like.

The fillers are capable of being used with or without surface treatment, and the fillers subjected to surface treatment enable the fluidity of the composition to increase and/or the filling factor to increase, and are industrially preferable.

Further, the average particle diameter of the fillers of 500 nm or less causes the transparency of the cured material to increase and is industrially preferable, and the average particle diameter of the fillers of 0.1 nm or less causes the viscosity of the resin composition to decrease and enables good formability.

The thermosetting resin composition comprised of these compounds usually has the form of liquid, and can be cured by heating to 100 to 250° C. Further, when the thermosetting resin composition of the invention is solid, it is possible to cure and form the composition by heating under the application of pressure using a pressing machine, low-pressure transfer molding machine or the like.

Thus obtained resin composition can be used suitably for applications of optical semiconductor devices such as sealing media, die bonding paste and die bonding materials obtained by curing the paste, chip coating materials to coat surroundings of chips, lens materials and the like of optical semiconductor devices.

By making use of its heat resistance and high transparency, the resin composition of the invention can be used suitably for lens materials such as eyeglass lenses, lenses for optical equipment, pick-up lenses for CD and DVD, lenses for automobile head lamps, projector lenses and the like, and various optical members such as optical fibers, optical waveguides, optical filters, optical adhesives, optical disk boards, display boards, coating materials such as antireflection coating and the like, and so on.

The resin composition of the invention provides hardly tarnished cured materials with excellent transparency particularly in resin sealing of optical semiconductor devices. Further, even at low temperatures between 80 and 150° C., by increasing the addition amount of the (C) component, the composition is cured in a short time of about 30 to 60 minutes to enable itself to be released from the mold. This cured material is transparent without discoloring, and is not tarnished and extremely excellent in transparency even after being subjected to post-curing at temperatures of 180° C. or less.

The method of curing and forming the resin composition of the invention is not particularly limited, and it is possible to form the resin composition, for example, by casting, low-pressure transfer molding, potting, dipping, pressure molding, injection molding and the like.

The thermosetting resin composition of the invention is suitably used as optical semiconductor sealing media, and in this case, among the optical semiconductors are LED lamps, chip LEDs, semiconductor lasers, photo couplers, photodiodes and the like.

The housing materials of semiconductor devices are not particularly limited, and include aromatic polyamides such as polyphthalamide and the like, engineering plastics such as 66 nylon, ceramics and the like, and particularly high adhesion is exhibited in the case of polyphthalamide.

Further, containing glass fibers in the housing material causes the adhesion strength to increase and is preferable, and the effects of the invention are remarkably produced in the content ranging from 5% to 40%, preferably from 10% to 30%, and particularly preferably from 15% to 25%.

Examples to clarify the effects of the invention will be described below. In addition, "part (s)" or "%" in the Examples and Comparative Examples are mass standard unless otherwise indicated.

Further, various properties in the Examples were evaluated by following methods.

(1) Epoxy Value

A resin sample was dissolved with benzyl alcohol and 1-propanol. After adding a potassium iodide aqueous solution and bromphenol blue indicator to the solution, titration was performed using 1N HCL, and a point at which the reaction system turned yellow from blue was determined as an equivalence point. An epoxy value was calculated from the equivalence point according to the following equation.

$$\text{Epoxy value(equivalent/100 g)}=(V \times N \times F)/(10 \times W)$$

W; Weight of a sample (g)
V; Titer (ml)
N; Normality of hydrochloric acid used in titration
F; Factor of hydrochloric acid used in titration (2) Viscosity of the Resin (Measurement Temperature: 25° C.)

The viscosity was measured using an E viscometer at 25° C.

(3) Molecular Weight

The molecular weight was measured by GPC. TSK guard columns HHR-H, TSKgel G5000HHR, TSKgel G3000HHR, and TSKgel G1000HHR made by TOSOH CORPORATION were coupled and used as columns, and analysis was carried out at speed of 1 ml/min. using chloroform as a mobile phase. An $R^1$ detector was used as a detector, and the weight average molecular weight was obtained using polystyrene of Easy Cal PS-2 (molecular weight distribution of 580 to 377400) made by Polymer Laboratories and styrene monomer (Mw: 104) as standard reference materials.

(Remarks) Molecular weight details: 377400, 96000, 19720, 4490, 1180, 188700, 46500, 9920, 2360, 580

(4) Conformation of the Progression of the Reaction

The progression of the reaction was checked by absorption (2160 cm$^{-1}$) of SiH by FT-IR.

(5) Glass Transition Temperature (Tg)

A rectangular sample of 50 mm*5 mm*2 mm was formed, and using a dynamic viscoelasticity measurement instrument, heated at speed of 2° C./min. in tensile mode, and the peak temperature of Tan δ was obtained as Tg.

(6) Thermal Shock Property

A silicone chip of 5 mm*5 mm*0.2 mm was placed in a form with the size of 10 mm*10 mm*2 mm, and the resin composition was cast and heated to obtain a sample piece. The obtained cured material was removed from the form, and tested in temperature cycle test with temperature cycling RT~–40° C.~100° C.~RT, and the presence or absence of occurrence of a crack was observed by eye inspection. In addition, the number of cycles in which a crack occurs was evaluated, and as the number is higher, the resin is resistance.

(7) Adhesion

The resin composition was cast into a resin piece made of polyphthalamide (AMODEL 4122 made by Solvay Advanced Polymers K.K) with a dent of 5 mmΦ and depth of 1 mm in the center of a plate of 20 mm*20 mm*2 mm, and heat-cured to prepare a sample piece. The obtained sample piece was subjected to the temperature cycle test with temperature cycling RT~–40° C.~100° C.~RT, and the presence or absence of occurrence of a crack was observed by eye inspection. The number of cycles in which peel occurs between the resin cured material and polyphthalamide resin piece was evaluated, and as the number is higher, the resin is indicative of more excellence in adhesion.

(8) Light Resistance

A plate of 40 mm*40 mm*2 mm was prepared, and irradiated with rays with a wavelength of 365 nm and illuminance of 2000 mW/cm$^2$ for 300 hours in an oven with a temperature of 100° C., and coloring was observed as n when coloring was not observed between prior to and subsequent to irradiation, Δ when the plate was slightly colored, X when the plate was colored, and ⊚ when the plate was not changed at all from the initial state. Then, the transmittance in 400 nm of the plate was measured prior to and subsequent to the aforementioned treatment with a spectrophotometer, and a ratio (percentage) of the transmittance subsequent to the treatment to the transmittance prior to the treatment was evaluated. The higher numeric value of percentage means that heat resistance is higher.

(9) Solder Heat Resistance

The resin composition was applied on a glass plate and heat-cured to obtain a sample piece of a cured film with a thickness of 100 micrometers. The obtained sample piece was subjected to pre-treatment for 12 hours on conditions of 30° C. and moisture 70%, and then, subjected to heat treatment at 250° C. for 20 minutes. Then, a change in transmittance in 400 nm between prior to and subsequent to the heat treatment was evaluated. The value is 100% when the change does not occur at all between prior to and subsequent to irradiation, and the higher value is indicative of more excellent solder heat resistance.

(10) LED Durability

Using a cup-shaped housing material made of polyphthalamide (Solvay Advanced Polymers' K.K, AMODEL 4122 with 22% of glass fibers contained), a III-nitride compound-semiconductor light emitting device including InGaN layers was installed on a sapphire substrate, the resin composition was putted thereon and heat-formed, and a surface-mount LED with an emission peak wavelength of 380 nm was prepared. The LED was caused to emit for 1000 hours, and the sealing resin was observed by eye inspection as with anoloring was not observed, x when the resin was colored, and Δm was prepared. The LED was caused to emit for ⊚ mis indicative of the resin being not changed at all from the initial state. Furthermore, 50 LEDs were prepared, luminous intensity was measured by photodiode, and a ratio of the luminous intensity after emission for 1000 hours at 85° C. to the initial luminous intensity (mcd) was measured to evaluate in percentage. In this case, a higher numeric value means higher heat resistance.

(11) Composition Storage Stability

The resin composition was stored at 25° C. for one month, and a ratio (=viscosity subsequent to storage/initial viscosity) of the viscosity subsequent to storage to the initial viscosity at 25° C. was evaluated. As the numeric value approaches "1", the storage stability is indicative of more excellence.

Synthesis Example 1

Dioxane (120 parts), 1,3,5,7-tetramethylcyclotetrasiloxane (60 parts, SiH: 1 mole), and 2% toluene solution (0.6 part) of platinum catalyst were added to a four-necked flask with an agitator, thermometer, reflux condenser, and drop funnel attached thereto, and heated to 60° C., and then, a 33% dioxane solution (267 parts) of polydimethylsiloxane terminated with vinyldimethylsiloxane (88 parts, vinyl group: 0.25 mole) with a molecular weight of 704 represented by following average composition formula (I) was dropped into the flask for 2 hours. After dropping the solution, the resultant was slowly heated, and further stirred at 80° C. for 3 hours.

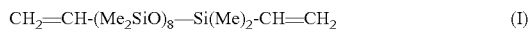

$$CH_2=CH-(Me_2SiO)_8-Si(Me)_2-CH=CH_2 \quad (I)$$

Then, 33% dioxane solution (288 parts) of 4-vinylcyclohexeneoxide (93 parts, 0.75 mole) was dropped for 2 hours. Further, the resultant was reacted at 80° C. for 5 hours, and it was confirmed that SiH disappeared by FT-IR. After that, the resultant was subjected to activated carbon treatment to remove volatile constituents, and sample 1 (230 parts) was obtained.

The epoxy value of sample 1 was 0.300 (equivalent/100 g), and the weight average molecular weight was measured by GPC and 2700. The viscosity of obtained polysiloxane at 25° C. was 2800 mPas, the viscosity subsequent to storage of one month at 25° C. was 2820 mPas, and excellent storage stability was indicated.

Synthesis Example 2

Dioxane (200 parts), hydrosiloxane (100 parts, SiH: 1 mole) with a molecular weight of 402 represented by following average composition formula (II), and 2% toluene solution (0.6 part) of platinum catalyst were added to a four-necked flask with an agitator, thermometer, reflux condenser, and drop funnel attached thereto, and heated to 80° C., and then, 4-vinylcyclohexeneoxide (93 parts, 0.75 mole) was dropped for 2 hours. After dropping, the resultant was slowly heated, and further stirred at 80° C. for 3 hours. Then, a 33% dioxane solution (267 parts) of polydimethylsiloxane terminated with vinyldimethylsiloxane (88 parts, vinyl group: 0.25 mole) with a molecular weight of 704 represented by following average composition formula (III) was dropped for 2 hours. Further, the resultant was reacted at 80° C. for 5 hours, and it was confirmed that SiH disappeared by FT-IR. After that, the resultant was subjected to activated carbon treatment to remove volatile constituents, and sample 2 (250 parts) was obtained.

$$Me_3SiO-(HMeSiO)_4-SiMe_3 \quad (II)$$

$$CH_2=CH-(Me_2SiO)_8-Si(Me)_2-CH=CH_2 \quad (III)$$

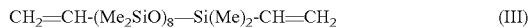

The epoxy value of sample 2 was 0.260 (equivalent/100 g), and the weight average molecular weight was measured by GPC and 2200. Further, the viscosity of obtained polysiloxane was 2600 mPas, the viscosity subsequent to storage of one month at 25° C. was 2610 mPas, and excellent storage stability was indicated.

Synthesis Example 3

Toluene (300 parts), dimethylpolysiloxane with OH groups at both terminals (95 parts, OH group: 0.25 mole) with a molecular weight of 758 represented by following average composition formula (IV), and 1,3,5,7-tetramethylcyclotetrasiloxane (60 parts, SiH group: 1 mole) were placed in a four-necked flask with an agitator, thermometer, reflux condenser, and drop funnel attached thereto.

$$HO(Me_2SiO)10H \quad (IV)$$

A 2% toluene solution (1.2 part) of platinum catalyst was added to the flask, and the resultant was refluxed at 117° C. for 3 hours. After cooling to 80° C., 280 parts of 33% toluene solution of 4-vinylcyclohexeneoxide (93 parts) was dropped for 2 hours. After dropping the solution, the resultant was further reacted at 80° C. for 5 hours, and it was confirmed that SiH disappeared by FT-IR. After that, the resultant was subjected to activated carbon treatment to remove volatile constituents, and sample 3 (230 parts) was obtained.

The epoxy value of sample 3 was 0.300 (equivalent/100 g), and the weight average molecular weight was 2300. Further, the viscosity of obtained polysiloxane was 3800 mPas, the viscosity subsequent to storage of one month at 25° C. was 4020 mPas, and practicable storage stability was indicated.

Synthesis Example 4

Dioxane (120 parts), 1,3,5,7-tetracyclotetrasiloxane (60 parts, SiH: 1 mole), and 2% toluene solution (0.6 part) of platinum catalyst were added to a four-necked flask with an agitator, thermometer, reflux condenser, and drop funnel attached thereto, and heated to 60° C., and then, a 33% dioxane solution (244 parts) of 4-vinylcyclohexeneoxide (81 parts, 0.65 mole) was dropped into the flask for 2 hours. After dropping the solution, the resultant was slowly heated, and further stirred at 80° C. for 3 hours. After that, a 33% dioxane solution (373 parts) of polydimethylsiloxane terminated with vinyldimethylsiloxane (123 parts, vinyl group: 0.35 mole) with a molecular weight of 704 represented by following average composition formula (V) was dropped for 2 hours. Further, the resultant was reacted at 80° C. for 5 hours, and it was confirmed that SiH disappeared by FT-IR. After that, the resultant was subjected to activated carbon treatment to remove volatile constituents, and sample 4 (260 parts) was obtained.

$$CH_2=CH-(Me_2SiO)_8-Si(Me)_2-CH=CH_2 \quad (V)$$

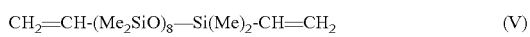

The epoxy value of sample 4 was 0.230 (equivalent/100 g), and the weight average molecular weight was measured by GPC and 5200. Further, the viscosity of obtained polysiloxane was 15000 mPas, and the viscosity subsequent to storage of one month at 25° C. was 18000 mPas.

Synthesis Example 5

Dioxane (120 parts), 1,3,5,7-tetramethylcyclotetrasiloxane (60 parts, SiH: 1 mole), and 0.1% dioxane solution (2.8 parts) of platinum catalyst were added to a four-necked flask with an agitator, thermometer, reflux condenser, and drop funnel attached thereto, and heated to 60° C., and then, a 33% dioxane solution (267 parts) of divinyltetramethyldisiloxane (28 parts, vinyl group: 0.3 mole) with a molecular weight of 186 was dropped into the flask for 2 hours. After dropping the solution, the resultant was slowly heated, and further stirred at 80° C. for 3 hours. After that, a 33% dioxane solution (288 parts) of 4-vinylcyclohexeneoxide (87 parts, 0.7 mole) was dropped into the flask for 2 hours. Further, the resultant was reacted at 80° C. for 5 hours, and it was confirmed that SiH disappeared by FT-IR. After that, the resultant was subjected to activated carbon treatment to remove volatile constituents, and sample 5 (150 parts) was obtained.

The epoxy value of sample 5 was 0.390 (equivalent/100 g), and the weight average molecular weight was measured by GPC and 1300. Further, the viscosity of obtained polysiloxane at 25° C. was 1200 mPas, the viscosity subsequent to storage of one month at 25° C. was 1820 mPas, and excellent storage stability was indicated.

Synthesis Example 6

Toluene (120 parts), 1,3,5,7-tetramethylcyclotetrasiloxane (60 parts, SiH: 1 mole), and dimethylpolysiloxane with OH groups at both terminals with a molecular weight of 684 (86 parts, OH group: 0.25 mole) represented by following average composition formula (I) were placed in a four-necked flask with an agitator, thermometer, reflux condenser, and drop funnel attached thereto. A 2% toluene solution (0.6 part) of platinum catalyst was added to the flask, and the resultant was refluxed for 3 hours.

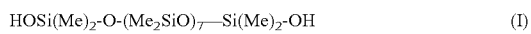  (I)

Then, a 33% toluene solution (288 parts) of 4-vinylcyclohexeneoxide (93 parts, 0.75 mole) was dropped for 2 hours. Further, the resultant was reacted at 80° C. for 5 hours, and it was confirmed that SiH disappeared by FT-IR. After that, the resultant was subjected to activated carbon treatment to remove volatile constituents, and sample 6 (222 parts) was obtained.

The epoxy value of sample 6 was 0.295 (equivalent/100 g), and the weight average molecular weight was measured by GPC and 2900. The viscosity of obtained polysiloxane at 25° C. was 3400 mPas, and the viscosity subsequent to storage of one month at 25° C. was 4900 mPas.

Example 1

Sample 1 of 100 parts, MeHHPA (methylhexahydrophthalic anhydride, acid equivalent: 168) of 50 parts, and DMBnA (dimethylbenzylamine) of 0.4 part were mixed uniformly, and the resin composition was prepared. The resin composition was cast in a form, and cured at 120° C. for 1 hour, then at 150° C. for 2 hours, and further at 170° C. for 2 hours to obtain a formed material. At that time, Tg was 190° C., the number of cycles for thermal shock property was 55, the number of cycles for adhesion was 40, light resistance was 88%, solder heat resistance was 100%, LED durability was 90%, and storage stability was 1.1.

Examples 2, 3, 5, 6 and Comparative Examples 2, 6

Resin compositions were prepared at rates as shown in Table 1. The resin compositions were cast in forms, and cured at 120° C. for 1 hour, then at 150° C. for 2 hours, and further at 170° C. for 2 hours to obtain formed materials. Table 2 shows evaluation results of resin cured materials obtained by curing and LEDs.

Example 7

Sample 1 of 100 parts and thermosetting cationic polymerization catalyst (ADEKA Optomer CP-66 made by ADEKA CORPORATION, structural formula (32)) of 0.1 part were mixed uniformly, and heat-cured at 180° C. for 5 hours. At that time, Tg was 80° C., the light resistance was 94%, the solder heat resistance was 100%, and the LED durability was 96%.

[Chemical 40]

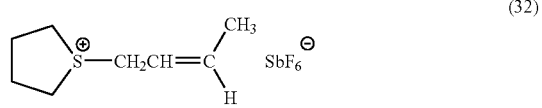  (32)

Example 8

Sixty parts of resin composition blended in Example 1 was added to 400 parts of toluene solution with 10 percent by weight of colloidal silica powder with the average particle diameter of 15 nanometers, and mixed uniformly, and the obtained resin composition solution was applied on a glass substrate at room temperature to have a film thickness of 100 micrometers. The obtained film was cured at 120° C. for 1 hour, then at 150° C. for 2 hours, and further at 170° C. for 2 hours to obtain a cured film. The glass substrate was subjected to the light resistance test, and the result of 92% was obtained.

Example 9

Sample 1 of 100 parts and 0.5 part of hexafluoroantimonatebis(dodecylphenyl)iodonium that is a UV curing cationic polymerization catalyst were mixed uniformly, and cured by irradiating with UV rays. At that time, Tg was 60° C., the light resistance was 78%, the solder heat resistance was 98%, and the LED durability was 88%.

Comparative Example 1

Mixed uniformly were 100 parts of DE4 (1,3,5,7-tetramethyl-tetrakis(3,4-epoxycyclohexylethyl)cyclotetrasiloxane eoixy value: 0.520), 87 parts of MeHHPA, and 0.4 part of DMBnA to prepare a resin composition. The resin composition was cast in forms, and cured at 120° C. for 1 hour, then at 150° C. for 2 hours, and further at 170° C. for 2 hours to obtain formed materials. At that time, Tg was 220° C., the number of cycles for thermal shock property was 25, the number of cycles for adhesion was 20, the light resistance was 48%, the solder heat resistance was 100%, the LED durability was 58%, and the storage stability was 1.2.

Comparative Example 3

Using organopolysiloxane (Sample name: EE, weight average molecular weight: 2300, epoxy value: 0.480) represented by a following structure different from the (A) component in the invention, the resin composition was prepared, and cured in the same way as in Example 1-5 to be evaluated. Table 2 shows evaluation results of resin cured materials obtained by curing and LEDs.

[Chemical 41]

  (33)

(In the formula, E represents a 3,4-epoxycyclohexylethylene group, and m represents a positive real number.)

Comparative Example 4

Mixed uniformly were 100 parts of (1,3,5,7-tetramethyl-tetrakis(3,4-epoxycyclohexylethyl)cyclotetrasiloxane (Sample DE4) and thermosetting cationic polymerization catalyst (ADEKA Optomer CP-66 made by ADEKA CORPORATION) of 0.1 part, and the resultant was heat-cured at 180° C. for 5 hours. At that time, Tg was 81° C., the light resistance was 58%, the solder heat resistance was 95%, and the LED durability was 62%.

Comparative Example 5

Sixty parts of resin composition blended in Comparative Example 1 was added to 400 parts of toluene solution with 10 percent by weight of colloidal silica powder with the average particle diameter of 15 nanometers, and mixed uniformly, and the obtained resin composition solution was applied on a glass substrate at room temperature to have a film thickness of 100 micrometers. The obtained film was cured at 120° C. for 1 hour, then at 150° C. for 2 hours, and further at 170° C. for 2 hours to obtain a cured film. The glass substrate was subjected to the light resistance test, and the result of 62% was obtained.

Comparative Example 7

A cured film was obtained as in Example 2 except 100 parts of sample 6 being used. At that time, Tg was 168° C., the number of cycles for thermal shock property was 150, the number of cycles for adhesion was 120, the light resistance was 78%, the solder heat resistance was 90%, and the LED durability was 83%.

TABLE 1

|  | Example 2 | Example 3 | Example 5 | Example 6 | Comparative Example 2 | Comparative Example 3 | Comparative Example 6 |
|---|---|---|---|---|---|---|---|
| Component (A) | Sample 1 | Sample 2 | Sample 4 | Sample 5 | DE 4 | EE | DE 4 |
| [Part] | 100 | 100 | 100 | 100 | 100 | 100 | 100 |
| Component (B) | MeHHPA | MeHHPA | MeHHPA | MeHHPA | MeHHPA | MeHHPA | MeHHPA |
| [Part] | 50 | 44 | 39 | 64 | 87 | 81 | 50 |
| Component (C) | DMBnA | DMBnA | DMBnA | DMBnA | DMBnA | DMBnA | DMBnA |
| [Part] | 0.4 | 0.4 | 0.4 | 0.4 | 0.4 | 0.4 | 0.4 |
| Component (E) | EG | EG | EG | EG | EG | EG | EG |
| [Part] | 5 | 5 | 5 | 5 | 5 | 5 | 5 |

DE4: 1,3,5,7-tetramethyl-tetrakis(3,4-epoxycyclohexylethyl)cyclotetrasiloxane (epoxy value: 0.520)

MeHHPA: Methylhexahydrophthalic anhydride (acid equivalent: 168)

EG: Ethylene glycol

DMBnA: Dimethylbenzylamine

EE: Me3SiO-(MeESiO)m-SiMe3

(In the formula, E represents a 3,4-epoxycyclohexylethylene group, and m represents a positive real number.)

TABLE 2

|  | Example 2 | Example 3 | Example 5 | Example 6 | Comparative Example 2 | Comparative Example 3 | Comparative Example 6 |
|---|---|---|---|---|---|---|---|
| Tg | 170° C. | 165° C. | 170° C. | 170° C. | 165° C. | 160° C. | 158° C. |
| Thermal shock property | >200 times | 150 times | >200 times | >300 times | 160 times | 40 times | 90 times |
| Adhesion | >200 times | 100 times | >200 times | >300 times | 180 times | 25 times | 85 times |
| Light resistance | ◯ 87% | ◯ 85% | ◎ 93% | ◎ 90% | X 50% | Δ 62% | ◯ 89% |
| Solder heat resistance | 98% | 96% | 98% | 97% | 80% | 75% | 97% |
| LED durability | ◯ 88% | ◯ 86% | ◎ 91% | ◎ 90% | X 39% | X 42% | ◯ 90% |
| Storage stability | 1.2 | 1.2 | 1.8 | 1.9 | 1.2 | 2.3 | 1.5 |

As can be seen from Table 2, the resin cured materials obtained by curing thermosetting resin compositions according to the invention and LEDs (Examples 2, 3, 5, 6) are excellent in adhesion, heat resistance and light resistance, further transparent, excellent in mechanical properties, and capable of being used suitably for sealing media of LEDs and the like. Meanwhile, any one of the resin cured materials of the Comparative Examples and LEDs (Comparative Examples 2, 3, 6, 7) did not satisfy all of the above-mentioned properties. Further, the resin cured material obtained by Example 1 is extremely excellent in light resistance, as compared with Comparative Example 1, and capable of being used suitably for lens materials of LEDs and the like.

Thus, according to the thermosetting resin composition of the invention, it is possible to obtain cured materials excellent in adhesion, heat resistance and light resistance, low in cure shrinkage and stress, thereby excellent in mechanical properties typified by thermal shock resistance and further with transparency. Moreover, the thermosetting resin composition of the invention is low in viscosity, and excellent in workability and storage stability.

INDUSTRIAL APPLICABILITY

The thermosetting resin composition of the invention provides low-stress cured materials without cure shrinkage excellent in adhesion to semiconductor devices and leadframes, heat resistance and moisture resistance, and is particularly suitable as the resin composition for materials for optical semiconductors such as light-emitting diodes, photodiodes and the like, particularly sealing media, and die bonding materials requiring high adhesion.

The present application is based on Japanese Patent Application No. 2005-303292 filed on Oct. 18, 2005, entire content of which is expressly incorporated by reference herein.

The invention claimed is:

1. A thermosetting resin composition comprising:
an organopolysiloxane (A) containing at least one selected from the group consisting of a compound represented by formula (1) and a compound represented by formula (2):

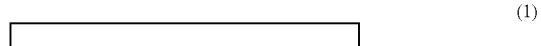

(1)

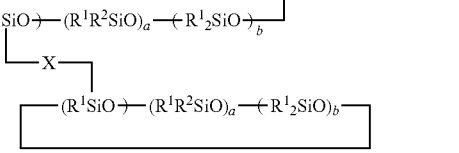

(2)

wherein $R^1$ independently represents a substituted or non-substituted monovalent hydrocarbon radical having from 1 to 10 carbon atoms, $R^2$ represents an epoxy group-containing organic group, $R^3$ represents $R^1$ or $R^2$, a independently represents an integer of 2 or more, b independently represents an integer of 0 or more, and X is a group represented by formula (3)

—Y—Z—Y— (3)

wherein Y represents a bivalent hydrocarbon radical having from 1 to 6 carbon atoms, and Z is a group represented by formula (4)

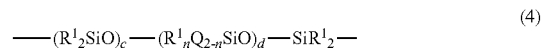

(4)

wherein $R^1$ independently represents a substituted or non-substituted monovalent hydrocarbon radical having from 1 to 10 carbon atoms, c represents an integer of 0 or more, n represents 0 or 1, d represents an integer of 0 or more, and Q is a group represented by formula (5)

—$P_0$—$P_1$ (5)

wherein $P_0$ is selected from the group consisting of:
a bivalent hydrocarbon radical having from 1 to 10 carbon atoms and which contains an -o- bond, an ether bond, or an ester bond;
a substituted dimethyl siloxane group; and
a non-substituted dimethyl siloxane group, and
$P_1$ is selected from the group consisting of a methyl group, a trimethylsilyl group, and structures respectively represented by following formulas (6) and (7)

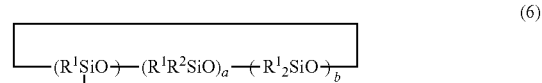

(6)

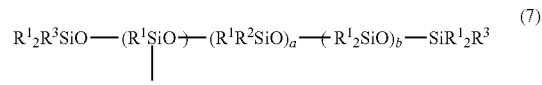

(7)

wherein the definitions of $R^1$, $R^2$, $R^3$, a, and b are the same as in formulas (1) and (2).

2. The thermosetting resin composition according to claim 1, wherein d is 0 in formula (4).

3. The thermosetting resin composition according to claim 1, further comprising:
10 to 200 parts by weight of acid anhydride (B); and
0 to 10 parts by weight of accelerator (C), and wherein a content of the organopolysiloxane (A) is 100 parts by weight.

4. The thermosetting resin composition according to claim 3, wherein the acid anhydride (B) is at least one selected from the group consisting of methylhexahydrophthalic anhydride, hexahydrophthalic anhydride, and methylnagic acid anhydride.

5. The thermosetting resin composition according to claim 3, wherein the accelerator (C) is at least one selected from the group consisting of imidazole compounds, quaternary ammonium salts, phosphonium salts, and organophosphinic compounds.

6. The thermosetting resin composition according to claim 1, wherein a content of the organopolysiloxane (A) is 100 parts by weight, and the thermosetting resin composition further comprises 0.001 to 10 parts by weight of a cationic polymerization catalyst (D).

7. The thermosetting resin composition according to claim 6, wherein the cationic polymerization catalyst (D) is a thermosetting cationic polymerization catalyst.

8. The thermosetting resin composition according to claim 1, wherein an epoxy value of organopolysiloxane (A) is in the range of 0.050 to 0.500 (equivalent/100 g).

9. The thermosetting resin composition according to claim 1, wherein a is from 2 to 10 in formulas (1) and (2).

10. The thermosetting resin composition according to claim 1, wherein Y in formula (3) is a bivalent hydrocarbon radical having from 1 to 4 carbon atoms.

11. The thermosetting resin composition according to claim 1, wherein $R^2$ is a group represented by following formula (8):

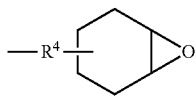

(8)

wherein $R^4$ represents a bivalent hydrocarbon radical having from 1 to 10 carbon atoms.

12. The thermosetting resin composition according to claim 1, wherein a weight average molecular weight of the organopolysiloxane (A) is in the range of 700 to 500000.

13. The thermosetting resin composition according to claim 1, further comprising: a compound (E) having a molecular formula with one or more alcoholic hydroxyl groups, a content of the compound (E) being from 0.1 to 50 parts by weight per 100 parts by weight of the organopolysiloxane (A).

14. The thermosetting resin composition according to claim 1, further comprising: a filler (F) having an average particle diameter of 500 nm or less, the filler (F) being blended into the thermosetting resin composition.

15. An optical semiconductor sealing medium obtained by curing the thermosetting resin composition according to claim 1.

16. A die bonding material for optical semiconductors obtained by curing the thermosetting resin composition according to claim 1.

17. The thermosetting resin composition according to claim 2, further comprising:
10 to 200 parts by weight of acid anhydride (B); and
0 to 10 parts by weight of accelerator (C), and wherein
a content of the organopolysiloxane (A) is 100 parts by weight.

18. The thermosetting resin composition according to claim 17, wherein the acid anhydride (B) is at least one selected from the group consisting of methylhexahydrophthalic anhydride, hexahydrophthalic anhydride, and methylnagic acid anhydride.

19. The thermosetting resin composition according to claim 18, wherein the accelerator (C) is at least one selected from the group consisting of imidazole compounds, quaternary ammonium salts, phosphonium salts, and organophosphinic compounds.

20. The thermosetting resin composition according to claim 19, wherein a content of the organopolysiloxane (A) is 100 parts by weight, and the thermosetting resin composition further comprises 0.001 to 10 parts by weight of a cationic polymerization catalyst (D).

21. The thermosetting resin composition according to claim 20, wherein the cationic polymerization catalyst (D) is a thermosetting cationic polymerization catalyst.

22. The thermosetting resin composition according to claim 21, wherein an epoxy value of organopolysiloxane (A) is in the range of 0.050 to 0.500 (equivalent/100 g).

23. The thermosetting resin composition according to claim 22, wherein a is from 2 to 10 in formulas (1) and (2).

24. The thermosetting resin composition according to claim 23, wherein Y in formula (3) is a bivalent hydrocarbon radical having from 1 to 4 carbon atoms.

25. The thermosetting resin composition according to claim 24, wherein $R^2$ is a group represented by following formula (8):

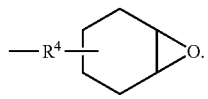

(8)

$R^4$ represents a bivalent hydrocarbon radical having from 1 to 10 carbon atoms.

26. The thermosetting resin composition according to claim 25, wherein a weight average molecular weight of the organopolysiloxane (A) is in the range of 700 to 500000.

27. The thermosetting resin composition according to claim 26, further comprising: a compound (E) having a molecular formula with one or more alcoholic hydroxyl groups, a content of the compound (E) being from 0.1 to 50 parts by weight per 100 parts by weight of organopolysiloxane (A).

28. The thermosetting resin composition according to claim 27, further comprising: a filler (F) having an average particle diameter of 500 nm or less, the filler (F) being blended into the thermosetting resin composition.

29. An optical semiconductor sealing medium obtained by curing the thermosetting resin composition according to claim 28.

30. A die bonding material for optical semiconductors obtained by curing the thermosetting resin composition according to claim 28.

* * * * *

UNITED STATES PATENT AND TRADEMARK OFFICE
CERTIFICATE OF CORRECTION

| | |
|---|---|
| PATENT NO. | : 7,932,319 B2 |
| APPLICATION NO. | : 12/083864 |
| DATED | : April 26, 2011 |
| INVENTOR(S) | : Hisanao Yamamoto et al. |

It is certified that error appears in the above-identified patent and that said Letters Patent is hereby corrected as shown below:

Column 30, Line 50 in Claim 4, delete "methylnagic" and insert -- methylnadic --, therefor.

Column 31, Lines 48-49 in Claim 18, delete "methylnagic" and insert -- methylnadic --, therefor.

Column 32, Line 30 in Claim 25, before "$R^4$" insert -- wherein --.

Signed and Sealed this
Nineteenth Day of July, 2011

David J. Kappos
*Director of the United States Patent and Trademark Office*